(12) United States Patent
Watakabe et al.

(10) Patent No.: US 10,459,304 B2
(45) Date of Patent: Oct. 29, 2019

(54) DISPLAY DEVICE

(71) Applicant: Japan Display Inc., Tokyo (JP)

(72) Inventors: Hajime Watakabe, Tokyo (JP); Isao Suzumura, Tokyo (JP); Hirokazu Watanabe, Tokyo (JP); Akihiro Hanada, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/395,491

(22) Filed: Apr. 26, 2019

(65) Prior Publication Data

US 2019/0250443 A1   Aug. 15, 2019

Related U.S. Application Data

(63) Continuation of application No. 15/723,300, filed on Oct. 3, 2017, now Pat. No. 10,317,763.

(30) Foreign Application Priority Data

Nov. 2, 2016   (JP) ................................. 2016-215086

(51) Int. Cl.
| | | |
|---|---|---|
| *H01L 29/10* | (2006.01) | |
| *H01L 29/12* | (2006.01) | |
| *G02F 1/1368* | (2006.01) | |
| *H01L 27/12* | (2006.01) | |
| *H01L 51/50* | (2006.01) | |
| *H01L 29/786* | (2006.01) | |
| *H01L 21/8234* | (2006.01) | |

(52) U.S. Cl.
CPC ........ *G02F 1/1368* (2013.01); *H01L 21/8234* (2013.01); *H01L 27/12* (2013.01); *H01L 29/786* (2013.01); *H01L 51/50* (2013.01); *G02F 2001/13685* (2013.01)

(58) Field of Classification Search
None
See application file for complete search history.

(56) References Cited

U.S. PATENT DOCUMENTS

2010/0127296 A1* 5/2010 Hioki .................... H01L 25/167
 257/98
2011/0049508 A1   3/2011 Kawamura et al.
(Continued)

FOREIGN PATENT DOCUMENTS

JP        2011-54812 A    3/2011
JP        2013-175718 A   9/2013

*Primary Examiner* — Calvin Y Choi
(74) *Attorney, Agent, or Firm* — Michael Best & Friedrich LLP

(57) ABSTRACT

A display device comprising: a first TFT using silicon (Si) and a second TFT using oxide semiconductor are formed on a substrate, a distance between the silicon (Si) and the substrate is smaller than a distance between the oxide semiconductor and the substrate, a drain source electrode of the first TFT connects with the silicon (Si) via a first through hole, a drain source electrode of the second TFT connects with the oxide semiconductor via a second through hole, metal films are made on the oxide semiconductor sandwiching a channel of the oxide semiconductor in a plan view, the channel has a channel width, an AlO layer is formed on the metal films and the oxide semiconductor, the second source drain electrode and the metal films are connected via the second through hole formed in the AlO layer.

11 Claims, 13 Drawing Sheets

(56) References Cited

U.S. PATENT DOCUMENTS

2013/0196468 A1 8/2013 Yamazaki
2016/0149052 A1* 5/2016 Ahn .................. H01L 29/78648
                                                                257/40
2017/0084641 A1* 3/2017 Lin .................... H01L 27/1251

* cited by examiner

DISPLAY DEVICE

CROSS-REFERENCE TO RELATED APPLICATIONS

This application is a continuation of U.S. patent application Ser. No. 15/723,300 filed on Oct. 3, 2017. Further, this application claims priority from Japanese Patent Application JP 2016-215086 filed on Nov. 2, 2016, the entire contents of which are hereby incorporated by reference into this application.

BACKGROUND OF THE INVENTION

(1) Field of the Invention

The present invention relates to a display device of hybrid structure, which includes both of TFTs of poly-silicon and TFTs of oxide semiconductor.

(2) Description of the Related Art

A liquid crystal display device comprises a TFT substrate where thin film transistors (TFI) and pixel electrodes are formed and a counter substrate opposing to the TFT substrate, wherein a liquid crystal layer is sandwiched between the TFT substrate and the counter substrate. Images are formed by controlling the transmittance of light in each of pixels. On the other hand, an organic EL display device forms color images by an organic light emitting layer and a TFT formed in individual pixels. An organic EL display device has a merit for a thin display device compared to a liquid crystal display device since an organic EL display device doesn't need a backlight.

LTPS (Low Temperature Poly-Si) is suitable for a TFT in a driving circuit. On the contrary, an oxide semiconductor has a high OFF resistance, thus gives a TFT of low OFF current.

Japanese patent laid open 2013-175718 and Japanese patent laid open 2011-54812 disclose TFTs having oxide semiconductors. Japanese patent laid open 2013-175718 discloses that metal oxide insulating film is formed on the channel of the oxide semiconductor, and the metal oxide insulating film is used as a gate insulating film. Japanese patent laid open 2011-54812 discloses to use the metal oxide or the oxide semiconductor as a sacrificing layer for the channel etching in the bottom gate type oxide semiconductor TFT.

SUMMARY OF THE INVENTION

A switching TFT in a pixel needs to have low leak current. A TFT of oxide semiconductor can make a low leak current TFT. Herein after an oxide semiconductor, which is amorphous and optically transparent, is called TAOS (Transparent Amorphous Oxide Semiconductor). TAOS includes IGZO (Indium Gallium Zinc Oxide), ITZO (Indium Tin Zinc Oxide), ZnON (Zinc Oxide Nitride), IGO (Indium Gallium Oxide), and so on. Herein after, an oxide semiconductor is represented by TAOS. TAOS has a character that a mobility of carriers is low, thus, sometimes it is difficult to form a built in driving circuit by the TFT of TAOS in the display device. Herein after, the term of TAOS is used also as a term of TFT including TAOS in this specification.

On the other hand the TFT of LTPS has high carrier mobility, thus a driving circuit can be formed by the TFT of LTPS. Herein after, the term of LTPS is used also as a term of TFT including LTPS. Since a TET of LTPS has a character that a leak current is comparatively high, serially connected two TFTs of LTPS are used for a switching TFT.

Consequently, it is reasonable to use the TAOS for a switching element and to use the LTPS for a driving circuit. However, since the material for the TAOS and the material for the LTPS are different, problems must be solved to form the TAOS and the LTPS on the same substrate. One of the problems is that the LTPS must be cleaned by hydrofluoric acid (HF) to remove the surface oxide before connecting a drain electrode and a source electrode. The TAOS is dissolved by the hydrofluoric acid (HF), thus, the same process cannot be applied to the TAOS.

The purpose of the present invention is to solve this problem and enables to form the LTPS and the TAOS on the same substrate.

The present invention solves the above problem; the concrete measures of the present inventions are as follows:

(1) A display device comprising: a first TFT using silicon (Si) and a second TFT using oxide semiconductor are formed on a substrate, a distance between the silicon (Si) and the substrate is smaller than a distance between the oxide semiconductor and the substrate, a drain source electrode of the first TFT connects with the silicon (Si) via a first through hole, a drain source electrode of the second TFT connects with the oxide semiconductor via a second through hole, metal films are made on the oxide semiconductor sandwiching a channel of the oxide semiconductor in a plan view, the channel has a channel width, an ALO layer is formed on the metal films and the oxide semiconductor, the second source drain electrode and the metal films are connected via the second through hole formed in the AlO layer.

(2) The display device according to (1), the AlO layer is formed to cover the display area except the area of the first through hole and the area of the second through hole in a plan view.

DETAILED DESCRIPTION OF THE PREFERRED EMBODIMENTS

The present invention will be described in detail referring to the following embodiments.

First Embodiment

Figure 1:
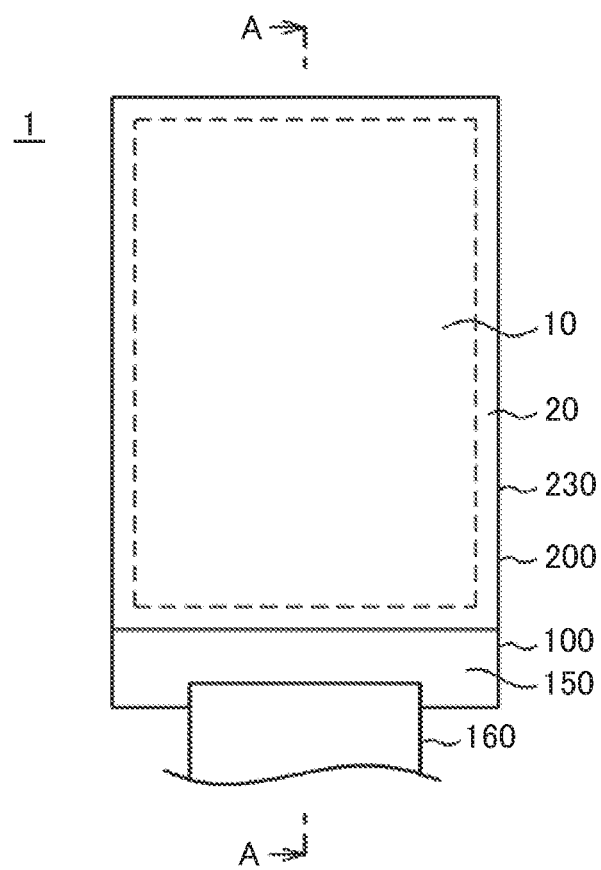
FIG. 1 is a plan view of a liquid crystal display device.
Figure 2:
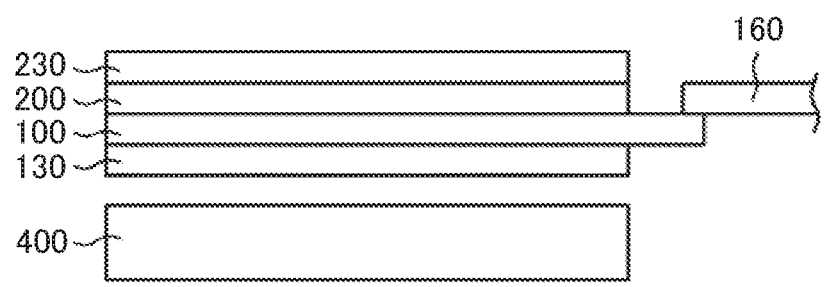
FIG. 2 is cross sectional view along the line A-A of FIG. 1.

FIG. 1 is a plan view of a liquid crystal display device 1 where the present invention is applied. FIG. 2 is cross sectional view along the line A-A of FIG. 1. In FIG. 1 and FIG. 2, the TFT substrate 100 and the counter substrate 200 are opposed to each other and a liquid crystal layer is sandwiched between the TFT substrate 100 and the counter substrate 200. A lower polarizing plate 130 is attached underneath the TFT substrate 100: an upper polarizing plate 230 is attached on the counter substrate 200.

The TFT substrate 100 is bigger than the counter substrate 200, a portion of the TFT substrate 100 where the counter substrate 200 doesn't overlap is the terminal area 150. The driver IC 170 that supply video signals is installed on the terminal area 150. The flexible wiring circuit substrate 160 is connected to the terminal area 150. An assembly of the TFT substrate 100, the liquid crystal layer, the counter substrate 200, the lower polarizing plate 130 and the upper polarizing plate 230 is called a liquid crystal display panel. The back light 400 is set at a back of the liquid crystal panel since the liquid crystal display panel itself doesn't emit light.

The liquid crystal display device can be divided into the display area 10 and the peripheral area 20 as described in FIG. 1. Many pixels are formed in the display area 10 and each of the pixels has a switching TFT. A driving circuit, which drives scanning lines or video signal lines, is formed in the peripheral area 20.

The TAOS, which has low leak current, is suitable for a TFT in a pixel; the LTPS, which has high mobility, is suitable for a driving circuit. In the LTPS TFT process, when connecting a drain electrode or source electrode with the LTPS, through holes must be made in the insulating films on the LTPS; and the surface of the LTPS at the through holes must be cleaned by hydrofluoric acid (HF) to remove silicon oxides on the surface of the LTPS.

However, if the same process is applied to the TAOS TFT, the TAOS is dissolved by the hydrofluoric acid (HF), thus, the TAOS TFT cannot be formed. This problem must be solved to form the LTPS TFT and the TAOS TFT on the same substrate. FIG. 6 is a structure of the present invention that solves the problem. FIGS. 3-6 are processes to realize the structure of FIG. 6.

Figure 3:
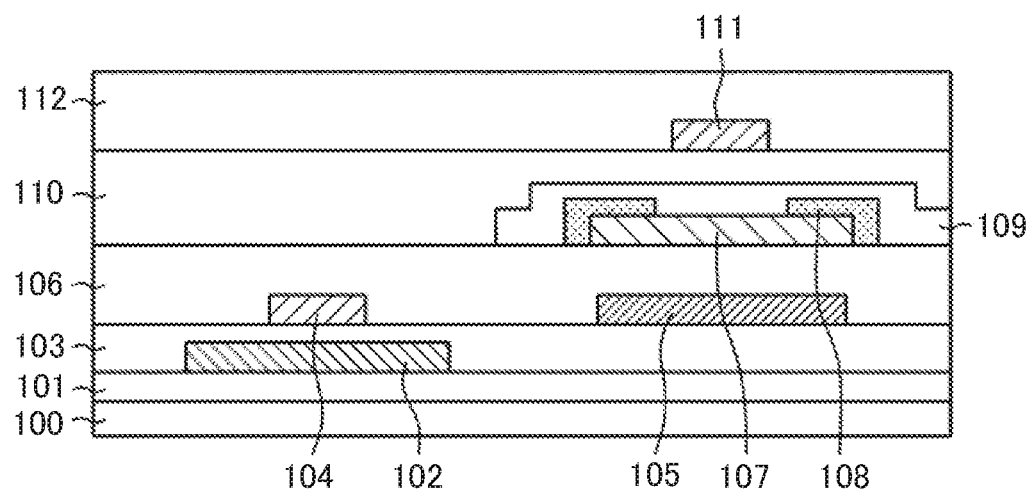
FIG. 3 is a cross sectional view of the first embodiment, before the through holes are formed.

FIG. 3 is cross-sectional view that: the undercoat 101 is formed on the TFT substrate 100 formed by glass, the LTPS 102 is formed on the undercoat 101. The undercoat 101 prevents the LTPS 102 from being contaminated by impurities from the TFT substrate 100. The undercoat 101 is often formed by a laminated film of silicon oxide (SiO) and silicon nitride (SiN).

The LTPS is formed as that: at the outset, a-Si (amorphous Si) is formed by CVD at about a thickness of 50 nm. Then the a-Si is transformed to poly-Si by applying excimer laser to the a-Si. FIG. 3 is a cross sectional view that the poly-Si (LTPS) 102 is patterned to island shape.

The gate insulating film 103 is formed over the LTPS 102. The gate insulating film 103 is a SiO film that is formed by CVD using TEOS (tetraethoxysilane) as a material. The gate metal 104 is formed on the gate insulating film 103. The gate metal 104 is formed by Al alloy, Mo, W or a laminated film of those metals.

In FIG. 3, the TAOS TFT is shown on the right hand side. In the region of the TAOS TFT, the light shielding film 105 is formed simultaneously as the gate electrode 104 for the LTPS. The TAOS 107 is formed in the display area, where the TAOS 107 is exposed to a light from the backlight, thus, the light shielding film 105 is used to suppress a photo current. Further, characteristics of the TAOS can be changed by being exposed to the light; the light shielding film 105 is useful in this point, too. By the way, if the LTPS 102 is used in the display area, it is preferable to set another light shielding film under the undercoat 101. The metal for the gate electrode 104 and the light shielding film 105 is formed by sputtering and patterned by photolithography.

As shown in FIG. 3, the first interlayer insulating film 106 is formed over the gate electrode 104 and the light shielding film 105. The first interlayer insulating film 106 is often formed by two layers. In this case it is preferable to set a SiN layer for the under layer and SiO layer for the upper layer because the first interlayer insulating film 106 works as an undercoat for the TAOS 107.

The TAOS 107 is formed on the first interlayer insulating film 106. The TAOS is formed by e.g. IGZO, in thickness of 10 nm to 100 nm on whole surface of the substrate; then the TAOS is patterned.

Figure 7:
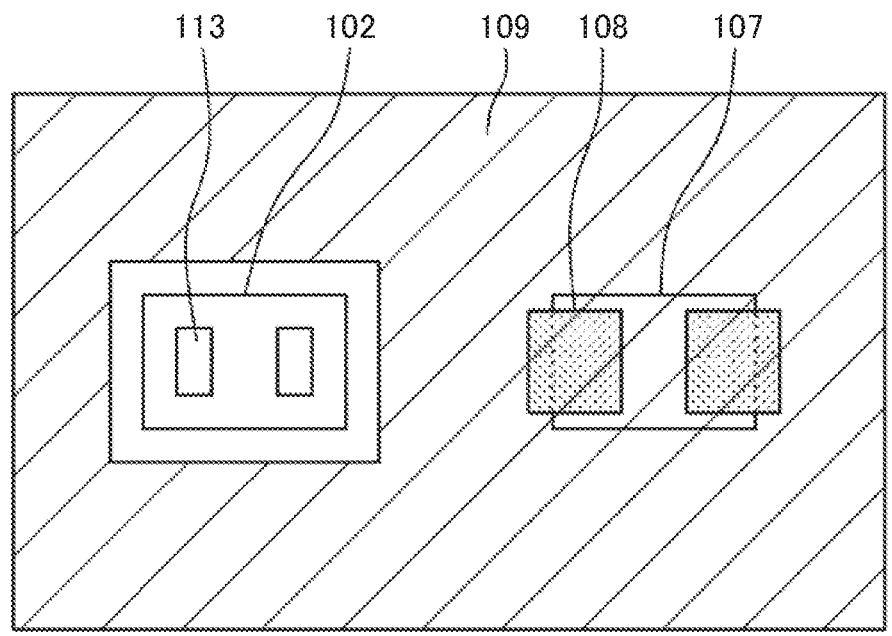
FIG. 7 is a plan view that the area of the AlO layer and the metal films are formed.

After that, the metal film 108 is formed on all over the substrate. The metal film 108 includes alloy film. As for metal film 108, Ti, Mo, W, Cr or alloys of those metals as MoW, MoCr, etc. are used. In the meanwhile, Al, etc. is etched by hydrofluoric acid, thus, if Al is used for the metal films 108, it is laminated by a barrier metal like Ti. After that, the metal film 108 is removed except the drain area and the source area of the TAOS 107. Namely, the metal films 108 are formed to sandwich the channel area in a plan view. FIG. 7 shows an example of a pattern of the metal film 108. The role of the metal film 108 is to prevent the TAOS from being dissolved by the hydrofluoric acid (HF) when through holes are formed in AlO layer 109 by the hydrofluoric acid (HF), which is used for removing the silicon oxide, namely, cleaning of the LTPS at the same time.

Since the metallic films 108 have a role to endure this cleaning process by the hydrofluoric acid (HF), the thickness of the metallic films is 10 nm or more is enough. In the meantime, the thickness of the AlO layer, which is formed on the metal film 108, is approximately 50 nm; thus, the thickness of the metal film is preferably 100 nm or less for the step coverage by the AlO layer. Therefore, the thickness of the metal film 108 is preferably 30 nm to 70 nm, and typically 50 nm.

By the way, in the area where the metal film 108 contacts the TAOS 107, the metal film 108 absorbs oxygen from the TAOS, thus, the TAOS becomes conductive. However, the channel area remains as semiconductor.

After that, the AlO layer 109 is formed in a thickness of about 50 nm by sputtering on the whole surface; then the AlO layer 109 is patterned. The main role of the AlO layer 109 is to prevent the TAOS 107 and the metal film 108 from being dissipated when forming through holes 114 by dry etching. Another role of the AlO layer 109 is to protect the TAOS from e.g. hydrogen.

The AlO layer 109 is formed in thickness 30 nm to 60 nm, typically 50 nm. As shown in FIG. 7, the AlO layer 109 is formed on all over the substrate except the area where the LTPS TFT is formed. The through holes 113 are formed for the LTPS TFT 102, thus, AlO layer 109 is not formed so that the AlO layer 109 doesn't hinder forming the through holes 113. In the meantime, as will be explained in FIG. 10, the AlO layer 109 is not necessarily made to avoid whole area of the LTPS TFT, but can be made to avoid only the areas of the through holes 113.

After that, the second gate insulating film 110 is formed by SiO. The second gate insulating film 110 can be formed by CVD using TEOS as a material. The second gate electrode 111 is formed on the second gate insulating film 110. The second gate electrode 111 is formed by Al alloy, Mo, W or a laminated film of those metals.

After that, the second interlayer insulating film 112 is formed. The second interlayer insulating film 112 can be formed by a laminated film of SiO layer and SiN layer. In this case the SiO layer is preferably the lower layer to prevent the TAOS from being deteriorated by hydrogen, which is discharged from the SiN layer.

Figure 4:
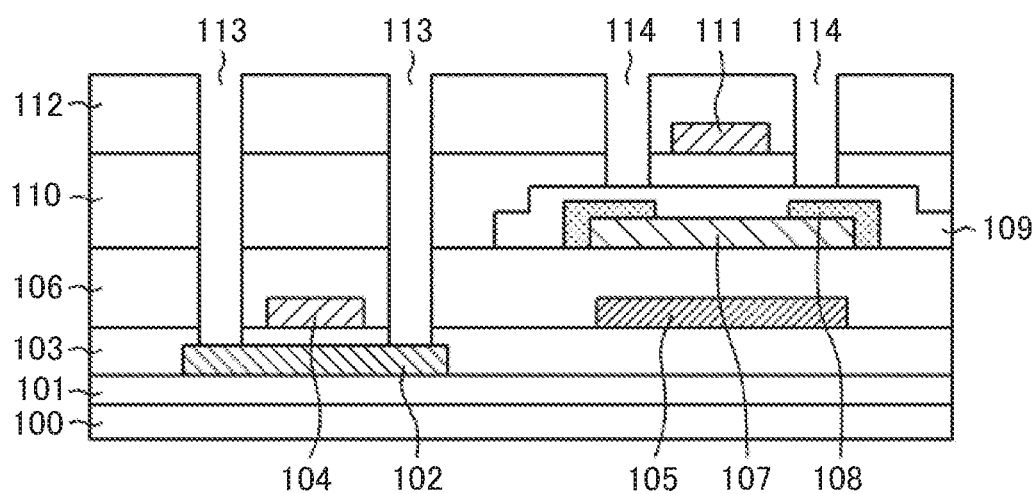
FIG. 4 is a cross sectional view, after the through holes are formed in the structure of FIG. 3.

FIG. 4 is a cross sectional view that the thorough holes 113 and 114 are formed in the structure of FIG. 3. The through holes 113 and 114 are formed by dry etching using the fluorine based gas. As depicted in FIG. 4, the through holes 113 for the LTPS TFT is formed through four layers of the second interlayer insulating film 112, the second gate insulating film 110, the first interlayer insulating film 106 and the first gate insulating film 103. On the contrary, the through holes 114 for the TAOS TFT is formed through two layers of the second interlayer insulating film 112 and the second gate insulating film 110. Therefore, there is a possibility that the TAOS 107 is dissolved.

The present invention solves this problem by forming the AlO layer 109 at the area where the through holes 114 are formed. Namely, the AlO layer 109 is endurable to the fluorine base gas, thus, it can be an etching stopper. FIG. 4 is a state that the through holes 113 reach to the LTPS in the LTPS TFT area while the through holes 114 are stopped at the AlO layer 109 in the TAOS TFT.

In FIG. 4, in the LTPS TFT, through holes 113 reach the LTPS 102; in this state, however, the LTPS TFT doesn't work even if the source and drain electrodes are formed because there is a silicon oxide on the surface of the LTPS 102. Therefore, in the area A in FIG. 5, hydrofluoric acid (HF) is applied in inside of the through holes 113 to remove the silicon oxide from the surface of the LTPS.

Figure 5:
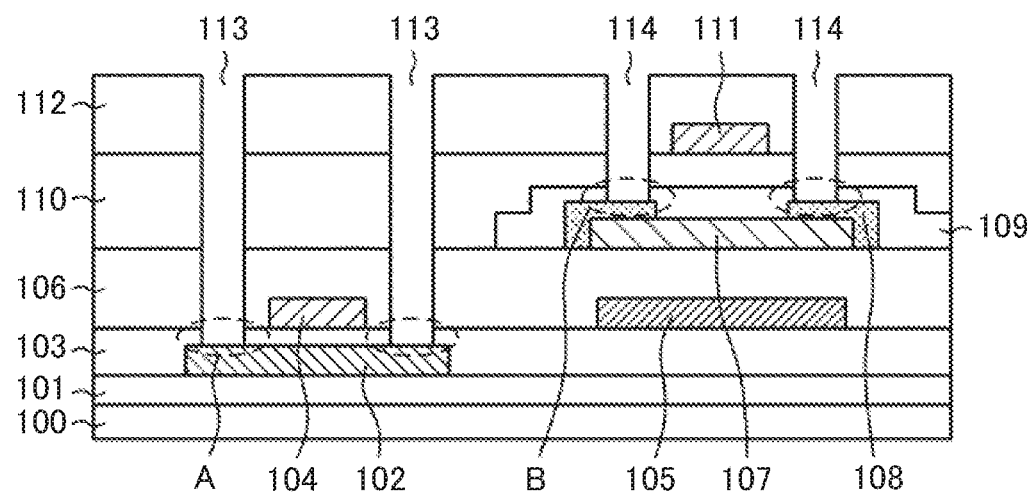
FIG. 5 is a cross sectional view that the through holes are formed in the AlO layer.
Figure 6:
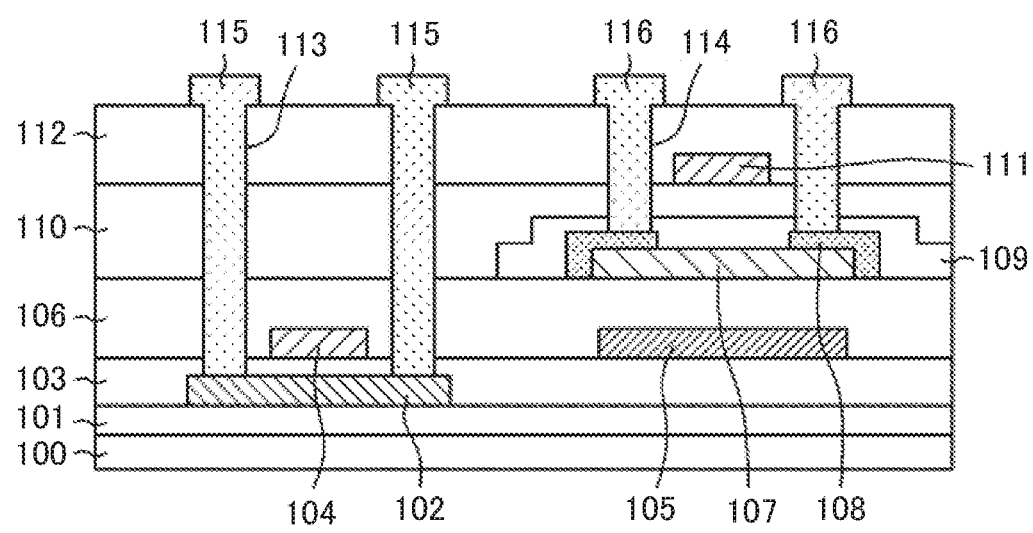
FIG. 6 is a cross sectional view that the SD electrodes are formed.

At this time, as shown at the area B of FIG. 5, in the through holes 114 for the TAOS TFT, the through holes 114 are formed in the AlO layer 114. The AlO layer 109 is endurable against the dry etching of fluorine based gas, however it is etched by the hydrofluoric acid (HF). The purpose of cleaning by fluorine acid is to remove the silicon oxide formed on the surface of the LTPS, thus, condition of the cleaning must be adjusted for this purpose. If the through holes 114 in the AlO layer 109 are formed quickly by the hydrofluoric acid, there exists a possibility that the TAOS 107 disappears in the through holes 114.

The present invention prevents this problem by forming the metal film 108 on the TAOS 107; thus, the present invention securely prevents the hydrofluoric acid (HF) to reach the TAOS. Therefore, the present invention can realize simultaneously removing the silicon oxide in the LTPS TFT and forming through holes 114 for the TAOS TFT without dissipation of the TAOS 107.

After that, as shown in FIG. 6, the first SD electrodes 115 are formed in the through holes 113 for the LTPS TFT, and the second SD electrodes 116 are formed in the through holes 114 for the TAOS TFT. Thus, the TAOS TFTs and the LTPS TFTs are formed on the same substrate with high production yield. By the way, the term of SD electrode means source/drain electrode in this specification; in other words the term of SD electrode is a general term for the source/drain electrode.

FIG. 7 is a plan view to show the area of the AlO layer 109 and the area of the metal films 108 corresponding to FIG. 4. In FIG. 7, elements other than the TAOS TFT and the LTPS TFT are omitted. In FIG. 7, the AlO layer 109 is formed on all over the substrate except the area of the LTPS TFT. Through holes for the TAOS TFT are not yet formed in FIG. 7.

Figure 8:
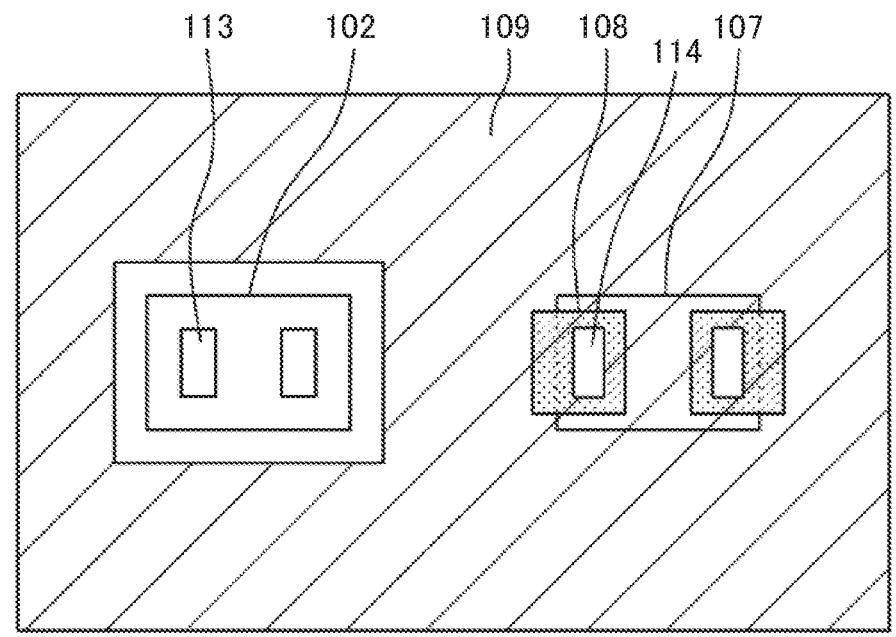
FIG. 8 is a plan view that the through holes are formed in the AlO layer.

FIG. 8 is a plan view that the through holes 114 for the TAOS TET are formed corresponding to FIG. 5. Those through holes 114 are simultaneously formed when through holes 113 for the LTPS TFT are cleaned by the hydrofluoric acid (HF).

Figure 9:
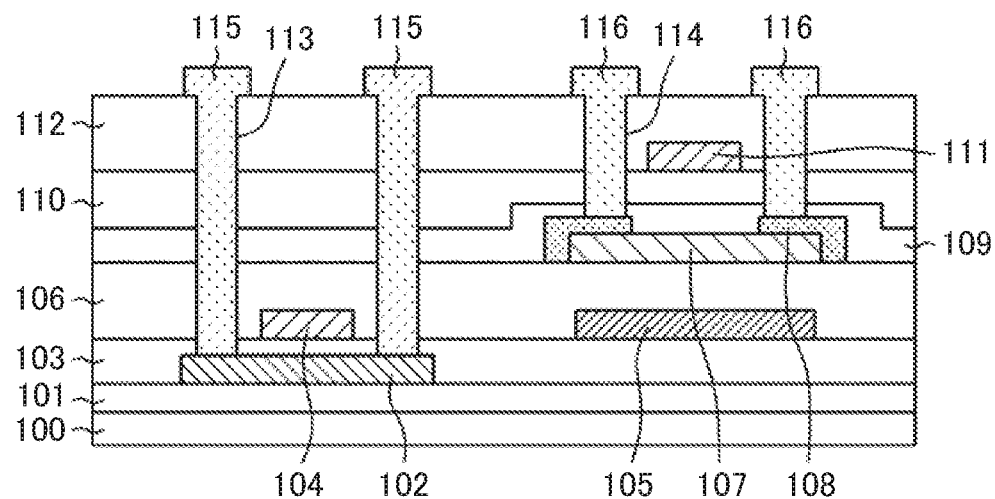
FIG. 9 is a cross sectional view up of another example of the first embodiment.

FIG. 9 is a cross sectional view of another example of the present embodiment. FIG. 9 differs from FIG. 6 in that the AlO layer 109 is formed all over the substrate except at the through holes 113. Consequently, in FIG. 9, most of the LTPS TFT is protected by the AlO layer 109 except the area of through holes 113.

Figure 10:
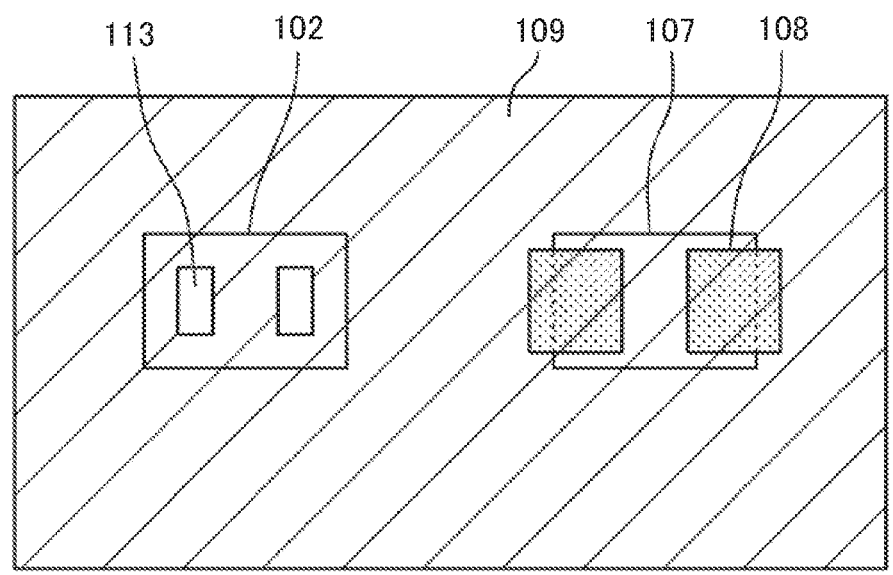
FIG. 10 is a plan view of FIG. 9 that shows the area of the AlO layer and the metal films.
Figure 11:
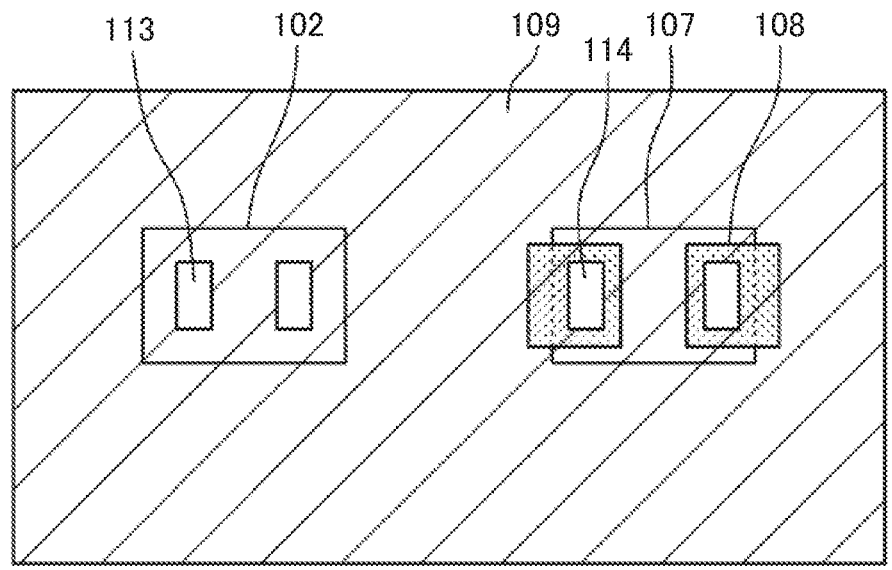
FIG. 11 is a plan view that the through holes are formed in the AlO layer.

FIG. 10 is a plan view of patterned AlO layer 109 corresponding to FIG. 9. FIG. 10 differs from FIG. 7 in that the AlO layer 109 is formed all over the substrate except at the through holes 113 for the LTPS. FIG. 11 is a plan view that the through holes 114 are formed for the TAOS TFT. FIG. 11 differs from FIG. 8 in that the AlO layer 109 is formed all over the substrate except at the through holes 113 for the LTPS.

Figure 12:
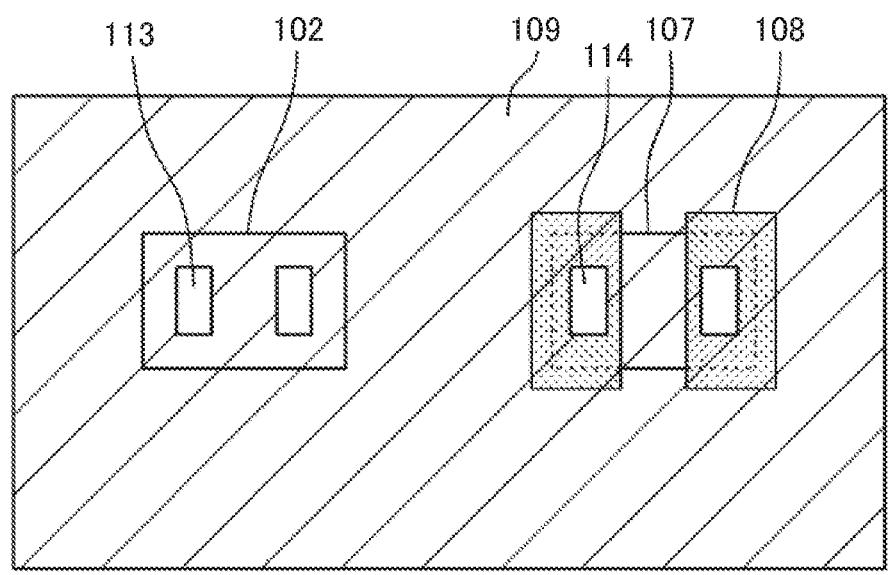
FIG. 12 is a plan view of yet another example of the first embodiment.

FIG. 12 is a plan view of yet another example of the present embodiment. FIG. 12 differs from FIG. 11 in the areas of the metal films 108 for the TAOS 107. In FIG. 12, the width of the metal film 108 in a channel width direction is wider than that of the TAOS TFT, thus, width of the channel of the TFT can be made wider.

Figure 13:
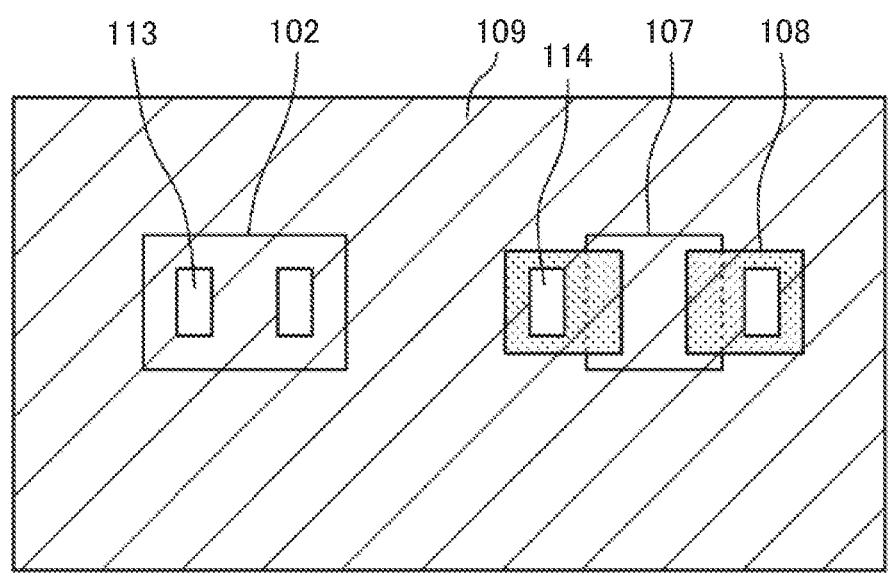
FIG. 13 is a plan view of yet another example of the first embodiment.

FIG. 13 is a plan view of yet another example of the present embodiment. FIG. 13 differs from FIG. 11 in the areas of the metal films 108 for the TAOS 107. In FIG. 13, the metal film extends outside of the TAOS 107 in a plan view; and the through holes 114 are formed at the area the metal film 108 and the TAOS 107 don't overlap. Thus, the TAOS 107 can be isolated also in a planar wise from the hydrofluoric acid (HF) during the process for the through holes.

In the above examples, in a plan view, the widths of the through holes 114 are narrower than the widths of the metal films; thus, the TAOS 107 is prevented from being invaded by the hydrofluoric acid (HF) from the side in the through hole. In the above examples, the plan views of the TAOS 107 are rectangle; however, the plan view of the TAOS can take any other shapes and the present invention described above is applicable to any of those configurations of the TAOS 107.

Second Embodiment

In embodiment 1, the TAOS TFT is a top gate type where a semiconductor layer is between the substrate and a gate electrode; however, the present invention is applicable to the TAOS TFT of a bottom gate type where a gate electrode is between the semiconductor layer and the substrate. The second embodiment is the case the TAOS TET is a bottom gate type. FIGS. 14-20 are cross sectional views that the present inventions are applied to the bottom gate type TAOS TFT.

Figure 14:
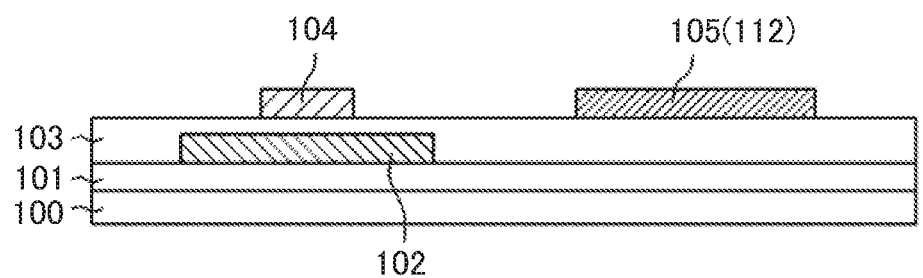
FIG. 14 is a cross sectional view of interim structure in the manufacturing process in the second embodiment.

FIG. 14 is a cross sectional view that the undercoat 101, the LTPS 102, the first gate insulating film 103, the first gate electrode 104 and the second gate electrode (light shielding electrode) 105 are formed on the TFT substrate 100. The structure is the same as FIG. 3, which was explained in the first embodiment. In FIG. 3, the electrode 105 is for light shielding; however, in FIG. 14, the electrode 105 has roles of both the gate electrode and the light shielding electrode for the TAOS TFT.

Figure 15:
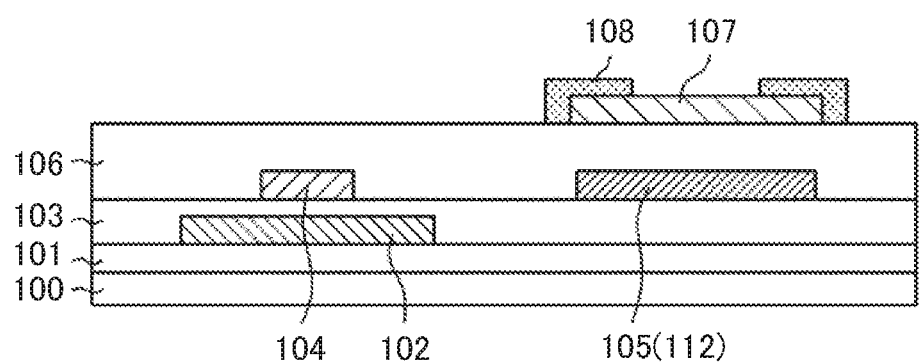
FIG. 15 is a cross sectional view of interim structure in the manufacturing process following the process of FIG. 14.

FIG. 15 is a cross sectional view that the first interlayer insulating film 106 is formed covering the first gate electrode 104 and the second gate electrode 105. The first interlayer insulating film 106 is often formed by a two layer structure, which is the same as explained in FIG. 3. In FIG. 15, the TAOS 107 is formed on the first interlayer insulating film 106 and then, is patterned. The metal films 108 are formed at the both sides of the TAOS 107. A role of the metal films is the same as explained in FIG. 3.

Figure 16:
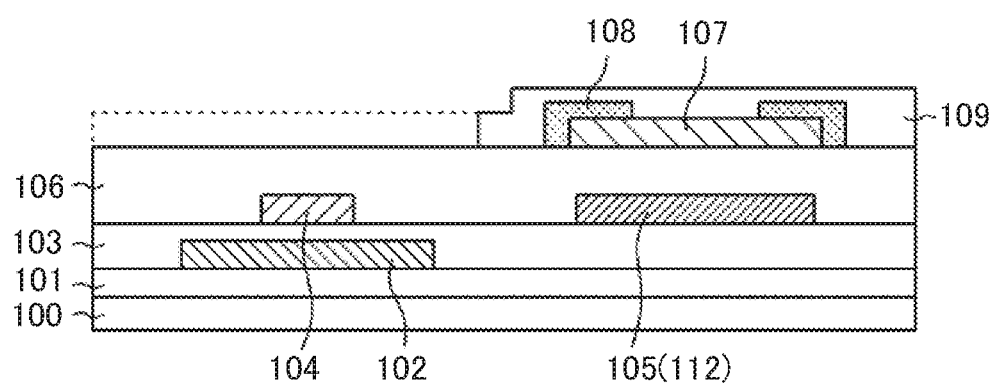
FIG. 16 is a cross sectional view of interim structure in the manufacturing process following the process of FIG. 15.

FIG. 16 is a cross sectional view that the AlO layer 109 is formed all over the substrate covering the TAOS 107, the metal films 108 and the first interlayer insulating film 106, after that, the AlO layer 109 is removed from the area where the LTPS 102 is formed. In FIG. 16, the dotted line shows the area where the ALO layer 109 is removed. The area of metal films 108 and the area of the AlO layer 109 are the same as FIGS. 7 and 8.

Figure 17:
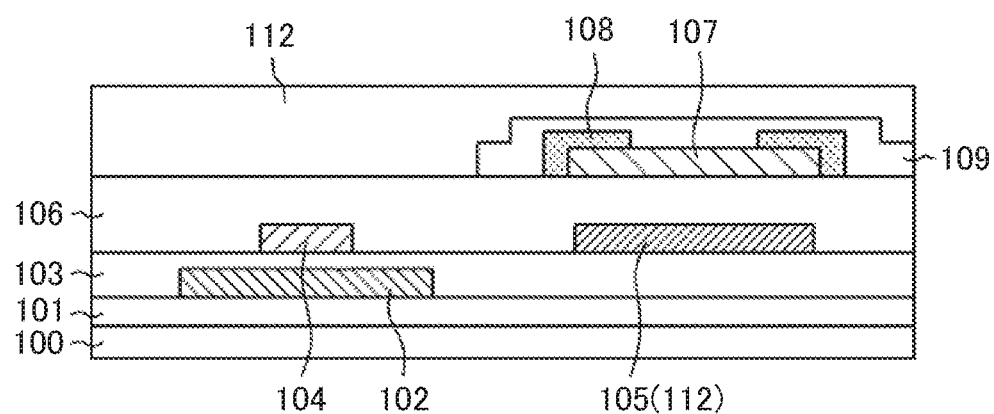
FIG. 17 is a cross sectional view of interim structure in the manufacturing process following the process of FIG. 16.

After that, as shown in FIG. 17, the second interlayer insulating film 112 is formed covering the AlO layer 108 and the first interlayer insulating film 106. The structure of the second interlayer insulating film 112 is the same as explained in FIG. 3. In this embodiment, the light shielding electrode 105 works as the gate electrode (the second gate electrode) 105 and the first interlayer insulating film 106 works as the gate insulating film; thus, the second gate insulating film 110 and the second gate electrode 111 are not necessary.

Figure 18:
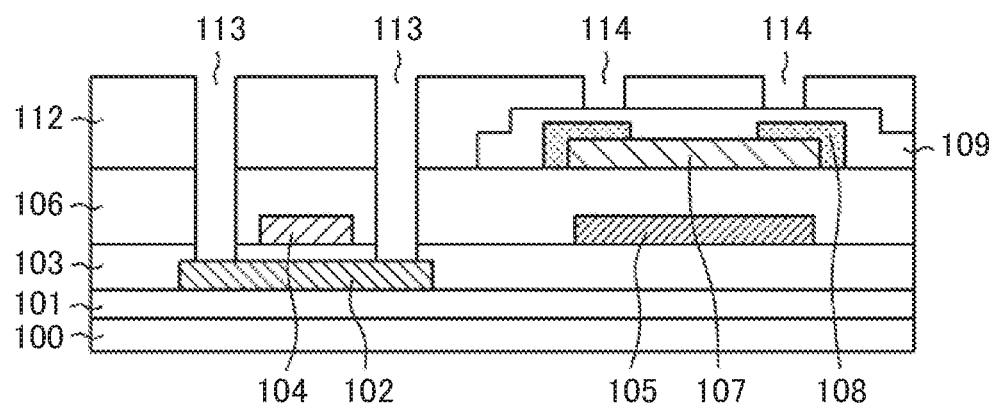
FIG. 18 is a cross sectional view of interim structure in the manufacturing process following the process of FIG. 17.

After that, as shown in FIG. 18, through holes 113 and 114 are formed in the insulating layers. The through holes 113 for the LTPS TET are made through three insulating layers while the through holes 114 for the TAOS TFT are made for one insulating layer if the AlO layer 109 and the metal film 108 are not formed. Thus, the problem explained in the first embodiment occurs.

In the present invention, however, the AlO layer 109 covers whole area of the TAOS TFT, and the metal films 108 are formed to cover the drain area and the source area of the TAOS TFT. Therefore, the TAOS 107 doesn't disappear during the dry etching for the thorough holes 114 using the fluorine base gas.

Figure 19:
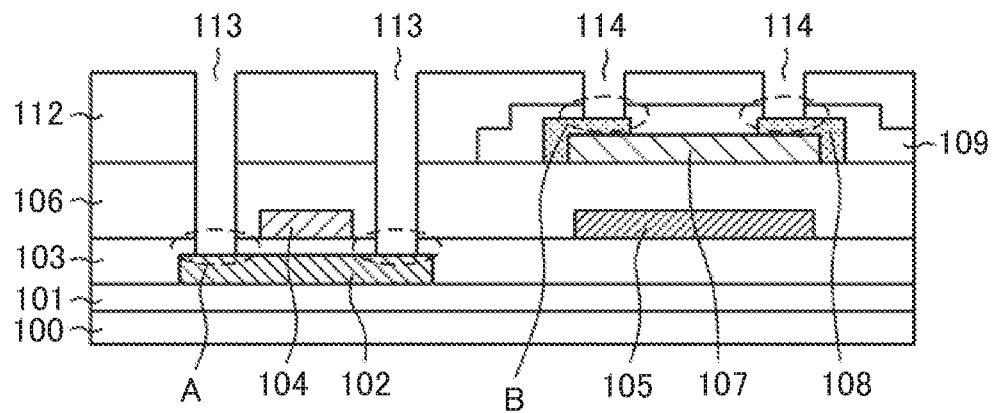
FIG. 19 is a cross sectional view of interim structure in the manufacturing process following the process of FIG. 18.
Figure 20:
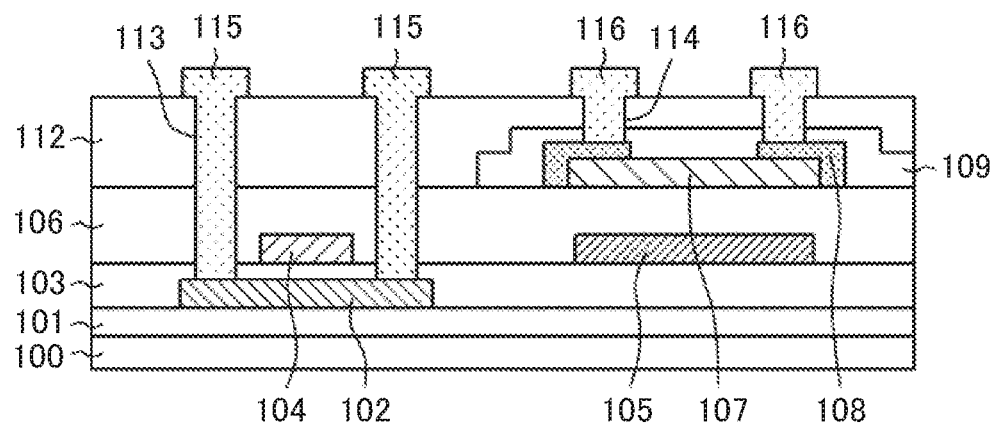
FIG. 20 is a cross sectional view of embodiment 2.

After the though holes 113 are formed, a cleaning by the hydrofluoric acid (HF) is made to remove the silicon oxide from the LTPS at the area A of FIG. 19 as explained in embodiment 1. During the cleaning by the hydrofluoric acid (HF), at the area B in FIG. 19, through holes 114 are formed in the AlO layer 109 for the TAOS TFT, and the metal film 108 works as an etching stopper against the hydrofluoric acid (HF) as explained in embodiment 1. After that as shown in FIG. 20, the first SD electrodes 115 for the LTPS and the second SD electrodes 116 for the TAOS are made.

Figure 21:
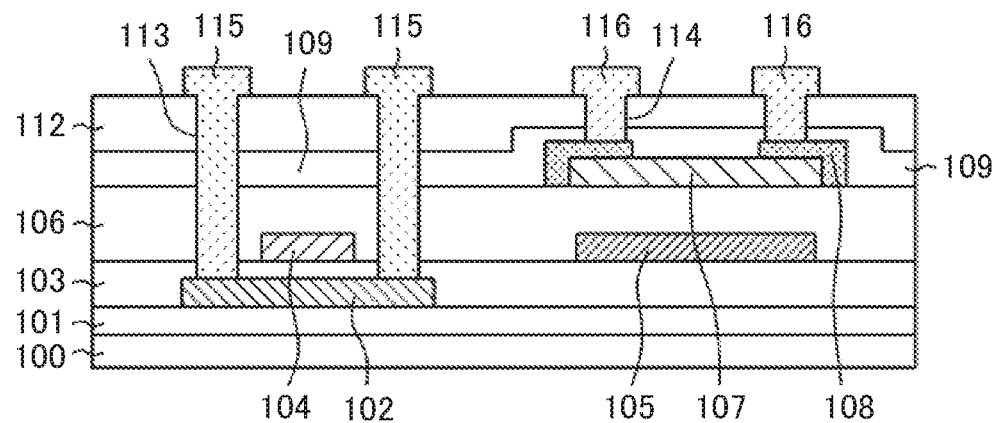
FIG. 21 is a cross sectional view of another example of embodiment 2.

FIG. 21 is a cross sectional view that the AlO layer 109 is formed all over the area except the areas where the through holes 113 for the LTPS TFT exist. FIG. 21 differs from FIG. 20 in that the AlO layer 109 is formed all over the LTPS TFT except the areas for the through holes 113. Thus, the AlO layer 109 has a barrier effect more effectively for the LTPS.

The plan views of the area of the AlO layer 109 and the metal films 108 are the same as FIGS. 10-13. The plan view of the TAOS is not limited to a rectangle but can be any shapes as in the case of the top gate type.

As described above, even the TAOS TFT is a bottom gate type, the silicon oxide can be removed from the through holes 113 for the LTPS without dissipating of the TAOS 107 at the through holes 114. Therefore, the TAOS TFT and the LTPS TFT of high reliability can be formed on the same substrate.

Third Embodiment

Figure 22:
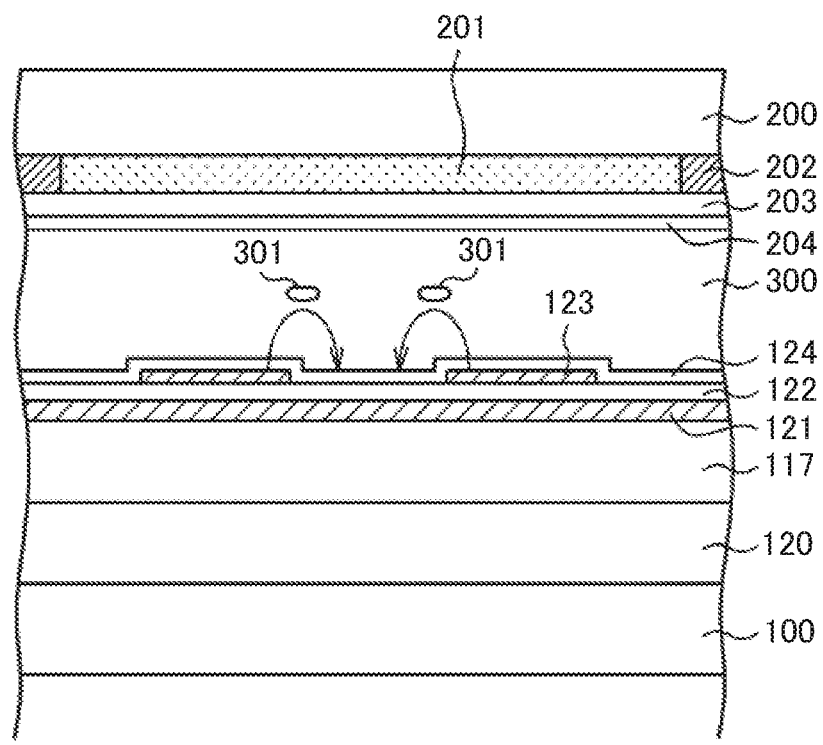
FIG. 22 is a cross sectional view of a display area of a liquid crystal display device.

FIG. 22 is a cross sectional view that the TAOS TFTs, explained in the first embodiment and the second embodiment, are applied to the display area of the liquid crystal display device. In FIG. 22, the TFT array layer 120 is formed on the TFT substrate 100. The TFT array layer 120 means the layer structure of the TAOS TFTs explained FIGS. 6, 9, 20, 21, etc. The organic passivation film 117 is formed on the TFT array layer 120.

FIG. 22 is an IPS (In Plane Switching) type liquid crystal display device that the common electrode 121 is formed in a solid plane shape on the organic passivation film 117. The capacitive insulating film 122 is formed covering the common electrode 121; the pixel electrode 123 is formed on the capacitive insulating film 122. The pixel electrode 123 is comb shaped or stripe shaped. The alignment film 124 is formed on the pixel electrode 123.

When the video signals are applied between the pixel electrode 123 and the common electrode 121, the line of force as depicted by the arrow in FIG. 22 is generated, and the liquid crystal molecules are rotated to change a transmittance of light in the liquid crystal layer 300; consequently, images are formed on the screen.

In FIG. 22, the counter substrate 200 is set opposing to the TFT substrate 100 sandwiching the liquid crystal layer 300. The color filter 201 and the black matrix 202 are formed on the counter substrate 200. The overcoat film 203 is formed covering the color filter 201 and the black matrix 202. The alignment film 204 for an initial alignment of the liquid crystal molecules 301 is formed on the overcoat film 203.

In the liquid crystal display device, when the video signal is written in the pixel electrode 123, the voltage is retained for one frame period by the storage capacitance formed between the pixel electrode 123 and the common electrode 121 via the capacitive insulating film 122. If a leak current is large, the voltage of the pixel electrode 123 changes; thus, e.g. flickers occur; consequently, proper images cannot be realized. Applying the TAOS TFTs of the present invention, the liquid crystal display device having low leak current and having high quality images can be realized.

Fourth Embodiment

Figure 23:
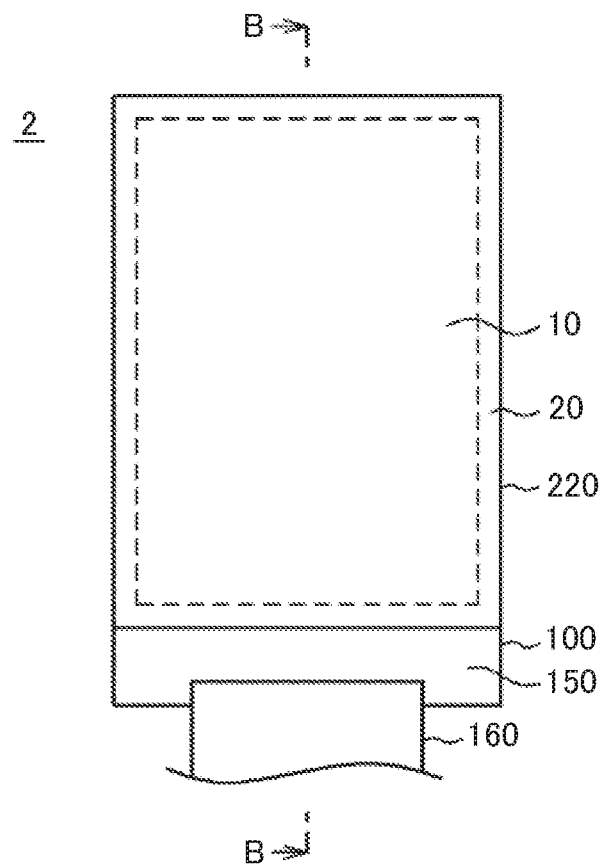
FIG. 23 is a plan view of an organic EL display device.

The combination of the LTPS TFT and the TAOS TFT explained in the first embodiment and in the second embodiment can be applied to an organic EL display device. FIG. 23 is a plan view of the organic EL display device 2. In FIG. 23, the display area 10 and the peripheral circuit area 20 are formed. In the display area, driving TFTs for the organic EL layers and switching TFTs are formed. The TAOS TFT, which has a low leak current, is suitable for the switching TFTs. The peripheral circuit is formed by TFTs, mainly by the LTPS TFTs.

In FIG. 23, the polarizing film 220 is attached on the display area 10 to suppress the reflection of outer light. Since the organic EL display device uses a reflection electrode, the polarizing film 220 is used to suppress the reflection of outer light. The terminal area 150 is formed outside of the display area 10. The flexible wiring circuit substrate 160 is connected to the terminal area 150 to supply power and signals to the organic EL display device.

Figure 24:
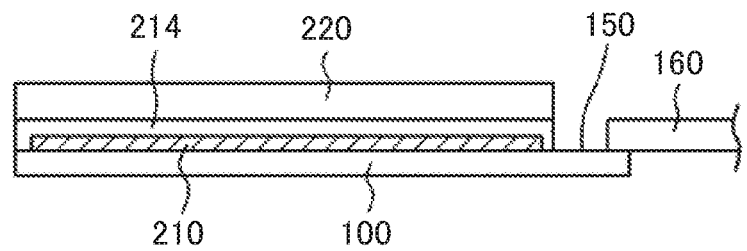
FIG. 24 is a cross sectional view along the line B-B of FIG. 23.

FIG. 24 is a cross sectional view of FIG. 23 along the line B-B of FIG. 23. In FIG. 24, the display element layer 210 including the organic EL display layer is formed on the TFT substrate 100. The display element layer 210 is formed corresponding to the display area 10. Since the material of the organic EL layer is decomposed by moisture, the protective layer 214 of SiN is formed to cover the display element layer 210. The polarizing plate 220 is adhered to the protective layer 214. The terminal area 150 is formed outside of the display element layer 210; the flexible wiring circuit substrate 160 is attached to the terminal area 150.

Figure 25:
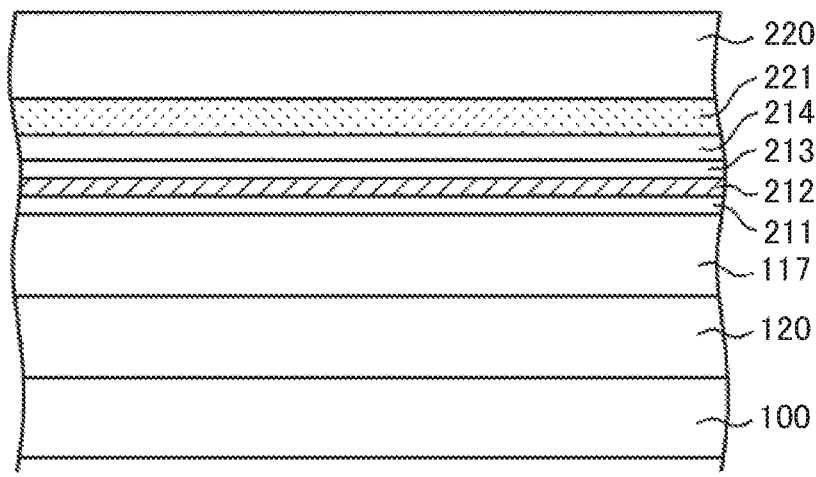
FIG. 25 is a cross sectional view of a display area of an organic EL display device.

FIG. 25 is a cross sectional view of the display area of the organic EL display device. In FIG. 25, the TFT array layer 120 is formed on the TFT substrate 100. The TAOS TFTs have structures explained e.g. in FIGS. 6, 9, 20 and 21. The organic passivation film 117 is formed on the TFT array layer 120.

In FIG. 25, the lower electrode 211, which works as an anode, is formed on the organic passivation film 117. The lower electrode 211 is a laminated film of e.g. the Al alloy, which works as a reflective electrode, and the ITO (Indium Tin Oxide), which works as an anode. The organic EL layer 212 is formed on the lower electrode 211. The organic EL layer 212 is laminated layers of the electron injection layer, the electron transport layer, the light emitting layer, the hole transport layer and the hole injection layer. The upper electrode 213, which works as a cathode, is formed on the organic EL layer 212. The upper electrode 213 is formed by a transparent conductive film as e.g. IZO (Indium Zinc Oxide), ITO. The upper electrode 213 can also be made by a thin metal film like silver. The protective film 214 of e.g. SiN is formed covering the upper electrode 213; the polarizing plate 220 is adhered to the protective film 214 by the adhesive 221 to suppress the reflection.

Several TFTs like driving TFTs and switching TFTs are formed in the TFT array layer 120. According to the present invention, the LTPS TETs and the TAOS TFTs are formed by common process, thus, several combinations of the LTPS TFTs and the TAOS TFTs are possible. Therefore, the organic EL display device having high quality images and low power consumption can be realized.

In the above explanations, the AlO layer is used as a protective film; however, other metal oxide layers can be used as far as they are endurable to the fluorine base gas and are possible to be etched by the hydrofluoric acid (HF).

In the above explanations, the TAOS TFTs are used in the display area and the LTPS TFTs are used in the peripheral circuit. However, according the requirement of the products, the TAOS TFTs can be added in the peripheral circuit and the LTPS TFTs can be added in the display area.

What is claimed is:

1. A semiconductor device comprising:
   a substrate,
   a first TFT comprising silicon (Si) and a second TFT comprising oxide semiconductor are formed over the substrate,
   an insulator formed over the first TFT and the second TFT,
   a first source electrode and a first drain electrode of the first TFT connect with the silicon (Si) via a first through hole and a second through hole formed in the insulator,
   a second source electrode and a second drain electrode of the second TFT connect with the oxide semiconductor via a third through hole and a fourth through hole formed in the insulator,
   a first metal film and a second metal film directly contact the oxide semiconductor in a sectional view, and the first metal film and the second metal film sandwich a channel of the oxide semiconductor in a plan view,
   an aluminum oxide layer contacts the first metal film and the second metal film and the oxide semiconductor,
   the second source electrode and the second drain electrode contact the first metal film and the second metal film via the third through hole and the fourth through hole formed in the aluminum oxide layer.

2. The semiconductor device according to claim 1, wherein
   the aluminum oxide layer is formed to cover the substrate except the areas of the first through hole, the second through hole, the third through hole and the fourth through hole in a plan view.

3. The semiconductor device according to claim 1, wherein
   the aluminum oxide layer is formed to cover the substrate except the area of the silicon (Si) of the first TFT and the areas of the third through hole and the fourth through hole in a plan view.

4. The semiconductor device according to claim 1, wherein
   the channel has a channel width, and
   a width of the channel width direction of the first metal film and the second metal film are bigger than the channel width.

5. The semiconductor device according to claim 1, wherein
   the oxide semiconductor, the first metal film and the third through hole overlap in a plan view, and
   the oxide semiconductor, the second metal film and the fourth through hole overlap in a plan view.

6. The semiconductor device according to claim 1, wherein
   the oxide semiconductor and the third through hole do not overlap in a plan view, and
   the oxide semiconductor and the fourth through hole do not overlap in a plan view.

7. The semiconductor device according to claim 1, wherein
   the channel has a channel width, and
   a width of the third through hole in the channel width direction is smaller than a width of the first metal film in the channel width direction, and a width of the fourth through hole in the channel width direction is smaller than a width of the second metal film in the channel width direction.

8. The semiconductor device according to claim 1, wherein
the first TFT is a top gate type TFT; a light shielding film of the second TFT is formed simultaneously with the gate electrode of the first TFT.

9. The semiconductor device according to claim 1, wherein
the first TFT is a bottom gate type TFT; a gate electrode of the second TFT is formed simultaneously with the gate electrode of the first TFT.

10. The semiconductor device according to claim 1, wherein
the first metal film and the second metal film are formed by either one of Ti, Mo, W or Cr or alloys of those metals.

11. The semiconductor device according to claim 1, wherein
the semiconductor device is a photo sensor device.

\* \* \* \* \*